United States Patent
Fu

(10) Patent No.: US 11,289,468 B2
(45) Date of Patent: Mar. 29, 2022

(54) PACKAGE STRUCTURE AND METHOD FOR MANUFACTURING THE SAME

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventor: Chih-Chieh Fu, New Taipei (TW)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 21 days.

(21) Appl. No.: 16/768,305

(22) PCT Filed: Jun. 12, 2019

(86) PCT No.: PCT/CN2019/090987
§ 371 (c)(1),
(2) Date: May 29, 2020

(87) PCT Pub. No.: WO2020/248174
PCT Pub. Date: Dec. 17, 2020

(65) Prior Publication Data
US 2021/0296301 A1    Sep. 23, 2021

(51) Int. Cl.
*H01L 21/56* (2006.01)
*H01L 25/00* (2006.01)
(Continued)

(52) U.S. Cl.
CPC ............ *H01L 25/50* (2013.01); *H01L 21/561* (2013.01); *H01L 21/568* (2013.01);
(Continued)

(58) Field of Classification Search
CPC ... H01L 25/50; H01L 21/561; H01L 21/6835; H01L 21/568; H01L 25/0657;
(Continued)

(56) References Cited

U.S. PATENT DOCUMENTS

| 7,018,866 | B2 * | 3/2006 | Sugaya | H01L 21/56 257/687 |
| 8,421,245 | B2 * | 4/2013 | Gonzalez | H01L 21/56 257/777 |
| 8,547,701 | B2 * | 10/2013 | Tuominen | H05K 1/188 361/728 |

FOREIGN PATENT DOCUMENTS

CN    106672888 A    5/2017

\* cited by examiner

*Primary Examiner* — Vu A Vu
(74) *Attorney, Agent, or Firm* — ScienBiziP, P.C.

(57) ABSTRACT

A package structure includes an inner wiring layer, a first dielectric layer, a first outer wiring layer, and an electronic component assembly. The first dielectric layer includes a first surface and a second surface facing away from the first surface. The inner wiring layer and the electronic component assembly are embedded into the first dielectric layer from the first surface. The first outer wiring layer is disposed on the second surface. The electronic component assembly includes a first electronic element and a second electronic element. The second electronic element is disposed close to the second surface, and an electrical connector of the second electronic element faces the second surface. The first electronic element is disposed on a side of the second electronic element facing away from the second surface, and exposed from the first surface. The first outer wiring layer electrically connects the electrical connector of the second electronic element and the inner wiring layer, respectively. A method for manufacturing the package structure is also provided.

17 Claims, 11 Drawing Sheets

(51) Int. Cl.
  *H01L 21/683* (2006.01)
  *H01L 25/065* (2006.01)
  *H01L 25/10* (2006.01)
  *H01L 23/00* (2006.01)
(52) U.S. Cl.
  CPC ...... *H01L 21/6835* (2013.01); *H01L 25/0657*
    (2013.01); *H01L 25/105* (2013.01); *H01L*
    *24/32* (2013.01); *H01L 2221/68359* (2013.01);
        *H01L 2224/32145* (2013.01); *H01L*
      *2225/06548* (2013.01); *H01L 2225/06558*
          (2013.01); *H01L 2225/1058* (2013.01)
(58) Field of Classification Search
  CPC ........... H01L 25/105; H01L 2225/1058; H01L
          2224/32145; H01L 2225/06548; H01L
            24/32; H01L 2225/06558; H01L
                            2221/68359
  USPC ....................................................... 257/774
  See application file for complete search history.

PACKAGE STRUCTURE AND METHOD FOR MANUFACTURING THE SAME

FIELD

The subject matter herein generally relates to packaging, especially to a package structure and a method for manufacturing the package structure.

BACKGROUND

In the existing circuit board with embedded components, only one component can be installed in each cavity due to limitation of the manufacturing process, and multiple components cannot be stacked. When the multiple components need to be embedded, a plurality of cavities needs to be provided on the circuit board, thereby occupying a lot of space of the circuit board. In addition, the embedded components can only be connected to the wiring layer of the circuit board on one side, which limits the circuit board.

SUMMARY

What is needed, is a method for manufacturing a package structure which is advantageous for circuit design.

What is also needed, is a package structure.

A method for manufacturing a package structure includes the following steps:

providing a carrier and forming an inner wiring layer on a surface of the carrier, the inner wiring layer comprising at least one opening, a portion of the carrier exposed from the at least one opening;

fixing a first electronic element on the carrier and received in each of the at least one opening, wherein an electrical connector of the first electronic element faces the carrier;

fixing a second electronic element on a side of the first electronic element facing away from the carrier, wherein an electrical connector of the second electronic element faces away from the carrier;

providing and pressing a first build-up board to the surface of the carrier with the inner wiring layer, wherein the first build-up board includes a first dielectric layer and a first copper layer, the first dielectric layer covers the inner wiring layer and infills the at least one opening, the first copper layer is formed on a side of the first dielectric layer facing away from the carrier;

forming at least one first connecting hole and at least one second connecting hole on the first build-up board, wherein the at least one first connecting hole corresponds to the second electronic element to expose the electrical connector of the second electronic element, the at least one second connecting hole corresponds to the inner wiring layer to expose a portion of the inner wiring layer;

forming a first outer wiring layer by performing a circuit manufacturing process on a side of the first build-up board facing away from the carrier, forming a first conductive structure in each of the at least one first connecting hole to electrically connect the first outer wiring layer and the second electronic element, and forming a second conductive structure in each of the at least one second connecting hole to electrically connect the first outer wiring layer and the inner wiring layer; and removing the carrier to obtain the package structure, wherein the electrical connector of the first electronic element is exposed.

Further, after the step of "removing the carrier to obtain the package structure, wherein the electrical connector of the first electronic element is exposed", at least one connecting pad is located on an outermost surface of the package structure, the method further comprises:

forming a solder mask on the outermost surface of the package structure, the at least one connecting pad located on the outermost surface of the package structure and the electrical connector of the first electronic element are exposed from the solder mask.

Further, after the step of "removing the carrier to obtain the package structure, wherein the electrical connector of the first electronic element is exposed", the method further comprises:

forming a third electronic element on the package structure to encapsulate the first electronic element and the second electronic element, wherein the third electronic element electrically connects the electrical connector of the first electronic element and electrically connects a connecting pad of the inner wiring layer by solder balls.

Further, the first electronic element is fixed on the carrier by a first glue layer.

Further, the first electronic element is fixed on the carrier by a first glue layer, the second electronic element is fixed on the side of the first electronic element facing away from the carrier.

Further, the carrier includes a base and copper foils formed on opposite surfaces of the base, the inner wiring layer is formed on a surface of the copper foil facing away from the base.

Further, the step of "removing the carrier to obtain the package structure, wherein the electrical connector of the first electronic element is exposed" further includes:

separating the base from the copper foils to obtain the base and two intermediate structures with the copper foils; and removing the copper foil from the intermediate structure by rapid circuit etching, and exposing the electrical connector of the first electronic element, thereby obtaining the package structure.

Further, before the step of "removing the carrier to obtain the package structure, wherein the electrical connector of the first electronic element is exposed", the method further comprises:

pressing a second build-up board to a side of the first outer wiring layer facing away from the carrier, the second build-up board covering the first outer wiring layer and infilling gaps of the first outer wiring layer; and forming a second outer wiring layer by performing a circuit manufacturing process on a side of the second build-up board facing away from the carrier, the second outer wiring layer electrically connecting the first outer wiring layer.

A package structure includes an inner wiring layer, a first dielectric layer, a first outer wiring layer, and an electronic component assembly. The first dielectric layer comprises a first surface and a second surface facing away from the first surface. The inner wiring layer and the electronic component assembly are embedded into the first dielectric layer from the first surface, and the inner wiring layer is flush with the first surface. The first outer wiring layer is disposed on the second surface. The electronic component assembly comprises a first electronic element and a second electronic element. The second electronic element is disposed close to the second surface, and an electrical connector of the second electronic element faces the second surface. The first electronic element is disposed on a side of the second electronic element facing away from the second surface, and the first electronic element is exposed from the first surface. The first outer wiring layer electrically connects the electrical connector of the second electronic element and the inner wiring layer, respectively.

Further, at least one first connecting hole and at least one second connecting hole are formed on the first dielectric layer, the first connecting hole communicates with the first outer wiring layer and the electrical connector of the second electronic element, the second connecting hole communicates with the first outer wiring layer and the inner wiring layer, the package structure further comprises a first conductive structure in the first connecting hole and a second conductive structure in the second connecting hole, the first conductive structure electrically connects the first outer wiring layer and the electrical connector of the second electronic element, the second conductive structure electrically connects the first outer wiring layer and the inner wiring layer.

Further, the package structure further includes a third electronic element. The third electronic element is disposed on a side of the inner wiring layer facing away from the first outer wiring layer to encapsulate the first electronic element and the second electronic element. The third electronic element electrically connects an electrical connector of the first electronic element and electrically connects a connecting pad of the inner wiring layer.

The method for manufacturing the package structure, the first electronic element and the second electronic element are stacked and embedded in the first dielectric layer, thereby increasing the number of the embedded components. The electrical connector of the second electronic element electrically connects the first outer wiring layer, and the first outer wiring layer electrically connects the inner wiring layer. At the same time, the electrical connector of the first electronic element is exposed from the first dielectric layer. So that the number of signal input/output channels (I/O count) of the package structure increases. In addition, the method for manufacturing the package structure is simple in process and easy to produce.

BRIEF DESCRIPTION OF THE DRAWINGS

Implementations of the present disclosure will now be described, by way of embodiments, with reference to the attached figures.

Description of symbols for main elements: 100 represents a package structure, 10 represents a carrier, 20 represents an inner wiring layer, 201 represents an opening, 31 represents a first glue layer, 41 represents a first electronic element, 411 and 431 respectively represent a connecting pad, 33 represents a second glue layer, 43 represents a second electronic element, 50 represents a first build-up board, 51 represents a first dielectric layer, 53 represents a first copper layer, 501 represents a first connecting hole. 503 represents a second connecting hole, 60 represents a first outer wiring layer, 601 represents a first conductive structure, 603 represents a second conductive structure, 55 represents a second build-up board, 56 represents a second dielectric layer, 58 represents a second copper layer, 65 represents a second outer wiring layer, 70 represents a solder mask, 80 represents a third electronic element, 11 represents a base, 13 represents a copper foil, 200 represents an intermediate structure. 40 represents an electronic component assembly, 511 represents a first surface, 513 represents a second surface.

Implementations of the disclosure will now be described, with reference to the drawings.

DETAILED DESCRIPTION

Implementations of the disclosure will now be described, by way of embodiments only, with reference to the drawings. The disclosure is illustrative only, and changes may be made in the detail within the principles of the present disclosure. It will, therefore, be appreciated that the embodiments may be modified within the scope of the claims.

Unless otherwise defined, all technical terms used herein have the same meaning as commonly understood by one of ordinary skill in the art. The technical terms used herein are not to be considered as limiting the scope of the embodiments.

Implementations of the disclosure will now be described, by way of embodiments only, with reference to the drawings. It should be noted that non-conflicting details and features in the embodiments of the present disclosure may be combined with each other.

Figure 1:
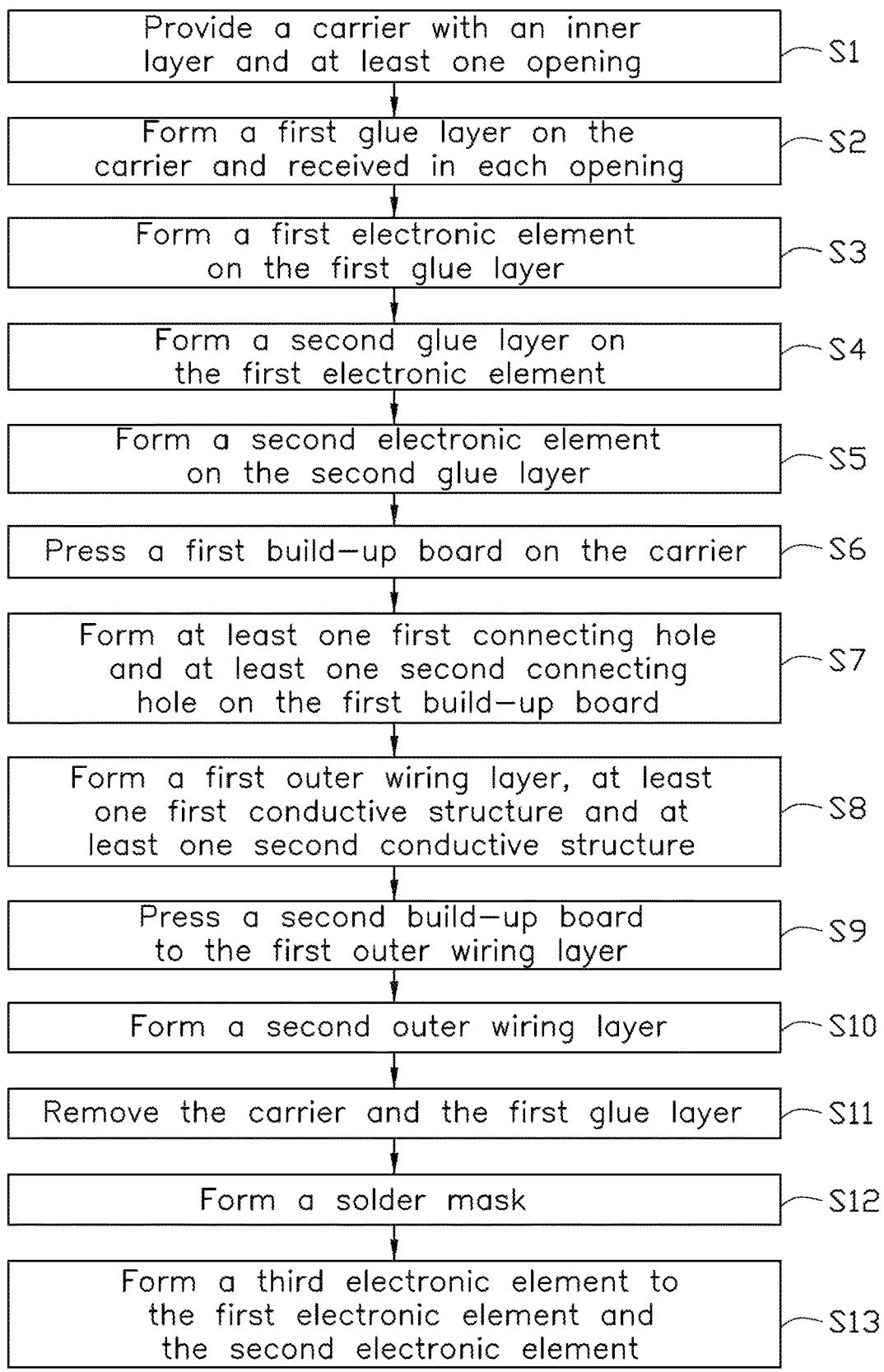
FIG. 1 is a flowchart of an embodiment of a method for manufacturing a package structure.
Figure 2:
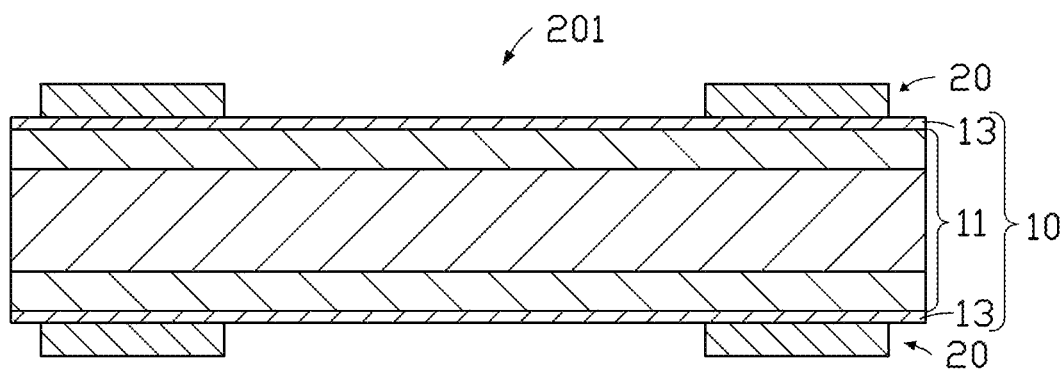
FIG. 2 is a cross-sectional view of an embodiment of a carrier with an inner wiring layer and at least one opening.

FIG. 1 illustrates a flowchart of a method in accordance with an embodiment. Referring to FIG. 1 to FIG. 16, an embodiment of the present invention of a method for manufacturing a package structure includes the following steps:

Step S1, referring to FIG. 2, a carrier 10 is provided, and an inner wiring layer 20 is formed on the carrier 10. The inner wiring layer 20 includes at least one opening 201 to expose the carrier 10. The inner wiring layer 20 further includes at least one connecting pad (not labeled).

In at least one embodiment, two inner wiring layers 20 are formed on opposite sides of the carrier 10. The inner wiring layer 20 on each side of the carrier 10 includes at least one opening 201 to expose the carrier 10.

Figure 3:
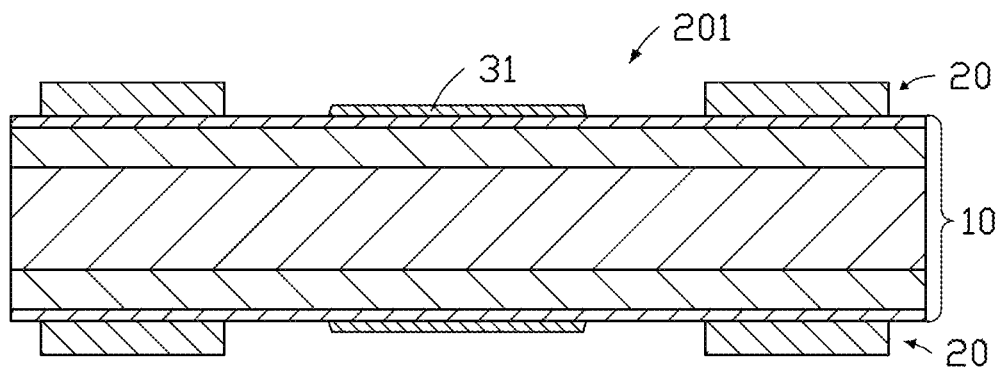
FIG. 3 is a cross-sectional view showing a first glue layer on the carrier of FIG. 2.

Step S2, referring to FIG. 3, a first glue layer 31 received in each opening 201 is formed on carrier 10 and received.

Figure 4:
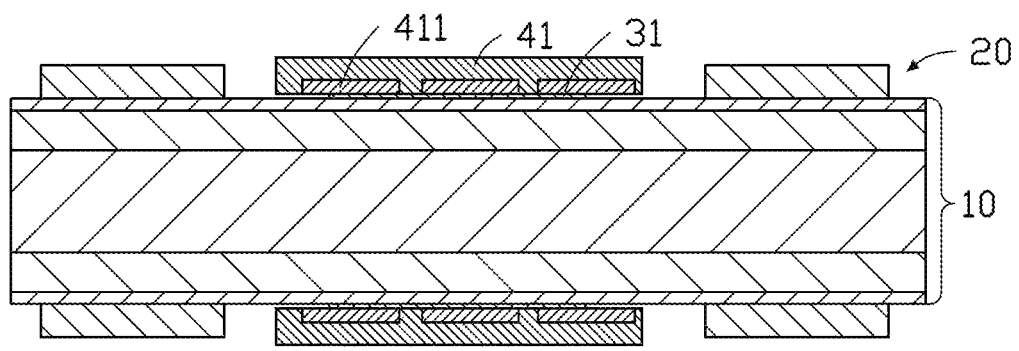
FIG. 4 is a cross-sectional view showing a first electronic element on the carrier of FIG. 3.

Step S3, referring to FIG. 4, a first electronic element 41 is formed on a side of the first glue layer 31 facing away from the carrier 10. An electrical connector of the first electronic element 41 faces the carrier 10.

In at least one embodiment, at least one connecting pad 411 is formed on a side of the first electronic element 41 facing the carrier 10 as the electrical connector.

In another embodiment the first glue layer 31 may be formed on the first electronic element 41, then the first electronic element 41 is received in the opening 201 and bonded to the carrier 10 by the first glue layer 31 to replace the above Step S2 and Step S3. In another embodiment, the first electronic element 41 may be fixed on the carrier 10 in other ways.

Figure 5:
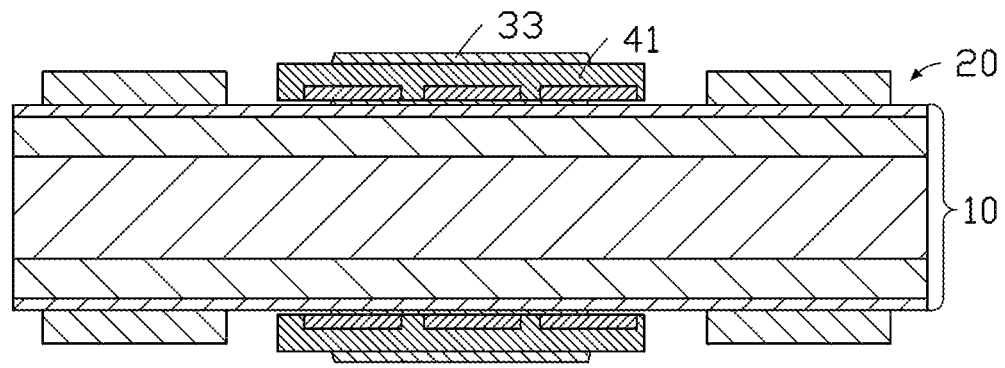
FIG. 5 is a cross-sectional view showing a second glue layer on the first electronic element of FIG. 4.

Step S4, referring to FIG. 5, a second glue layer 33 is formed on a side of the first electronic element 41 facing away from the carrier 10.

Figure 6:
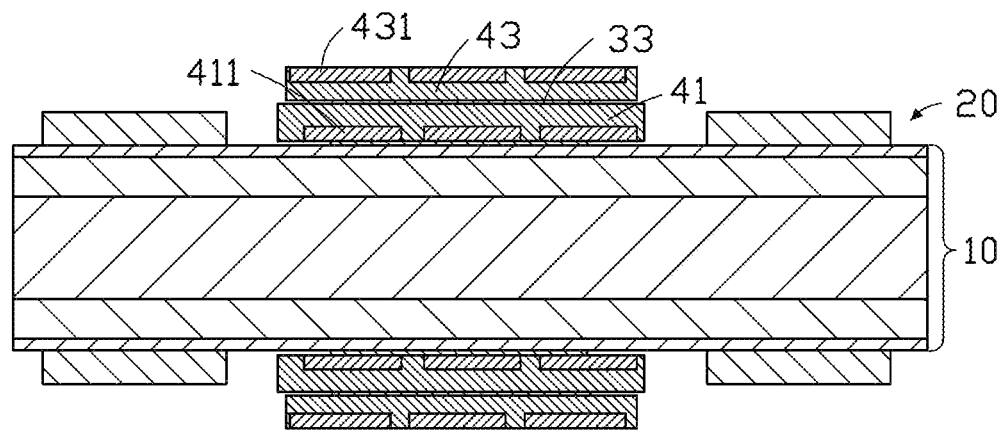
FIG. 6 is a cross-sectional view showing a second electronic element on the second glue layer of FIG. 5.

Step S5, referring to FIG. 6, a second electronic element 43 is formed on a side of the second glue layer 33 facing away from the carrier 10. An electrical connector of the second electronic element 43 faces away from the carrier 10.

In at least one embodiment, at least one connecting pad 431 is formed on a side of the second electronic element 43 facing away from the carrier 10 as the electrical connector.

In another embodiment, the second glue layer 33 may be formed on the second electronic element 43, then the second electronic element 43 is bonded to the first electronic element 41 by the second glue layer 33 to replace the above Step S4 and Step S5. In another embodiment, the second electronic element 43 may be fixed on the carrier 10 in other ways.

Figure 7:
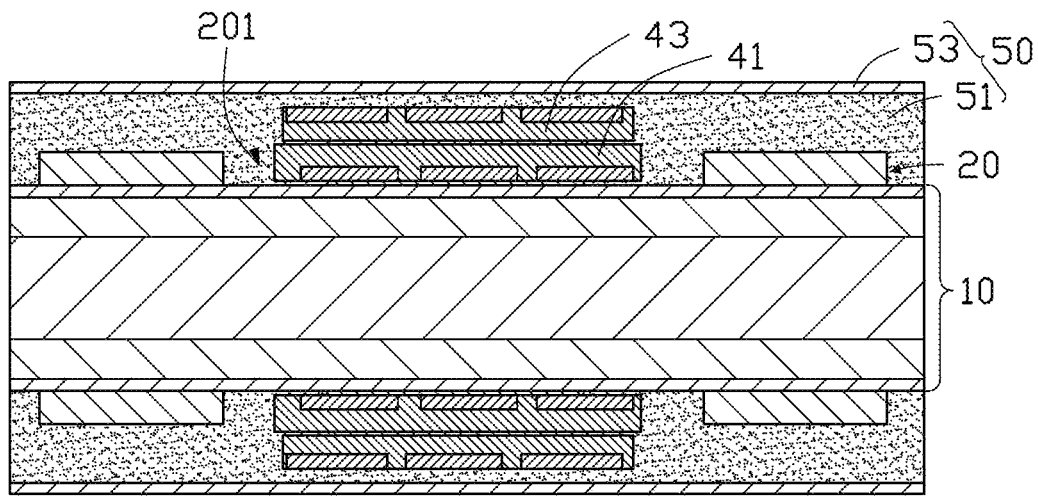
FIG. 7 is a cross-sectional view showing a first build-up board on the carrier of FIG. 6.

Step S6, referring to FIG. 7, a first build-up board 50 is provided and pressed and bonded to a surface of the carrier 10. The inner wiring layer 20, the first electronic element 41, and the second electronic element 43 are sandwiched between the first build-up board 50 and the carrier 10.

In at least one embodiment, the first build-up board 50 may include a first dielectric layer 51 and a first copper layer 53 formed on a surface of the first dielectric layer 51. A surface of the first dielectric layer 51 facing away from the first copper layer 53 is combined with the carrier 10 to cover the inner wiring layer 20. A fluidity of the first dielectric layer 51 increases during the pressing, and the first dielectric layer 51 infills the opening 201. Therefore, the inner wiring layer 20, the first electronic element 41, and the second electronic element 43 are embedded in the first dielectric layer 51.

The first dielectric layer 51 may be made of a material selected from polypropylene, epoxy resin, polyurethane, phenolic resin, urea resin, melamine-formaldehyde resin, unsaturated polyester resin, polyimide, and any combination thereof.

In at least one embodiment, the number of the first build-up board 50 is two, which are pressed to opposite surfaces of the carrier 10 with the inner wiring layers 20.

Figure 8:
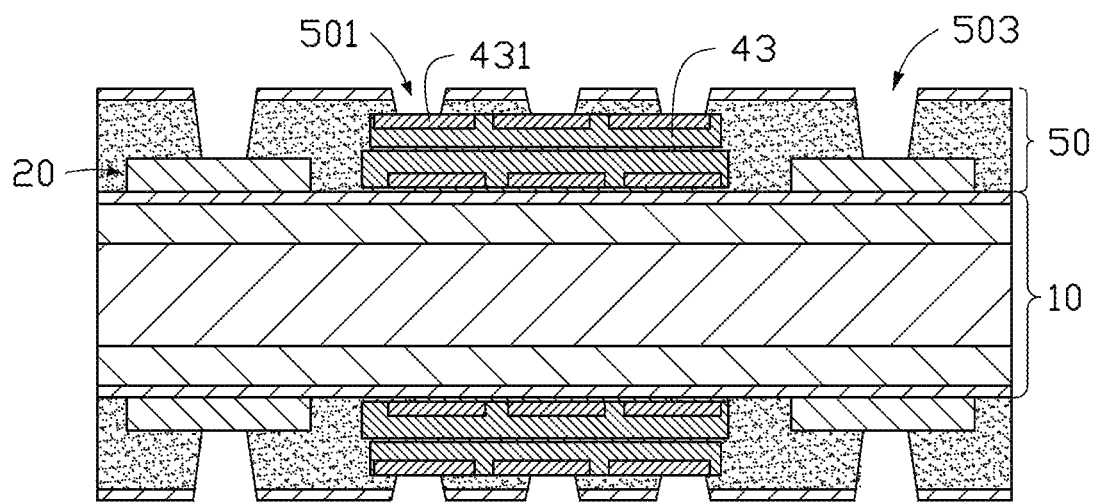
FIG. 8 is a cross-sectional view showing at least one first connecting hole and at least one second connecting hole on the first build-up board of FIG. 7.

Step S7, referring to FIG. 8, at least one first connecting hole 501 and at least one second connecting hole 503 are formed on the first build-up board 50. The first connecting hole 501 corresponds to the second electronic element 43 to expose the electrical connector of the second electronic element 43. The second connecting hole 503 corresponds to the inner wiring layer 20 to expose a portion of the inner wiring layer 20.

Figure 9:
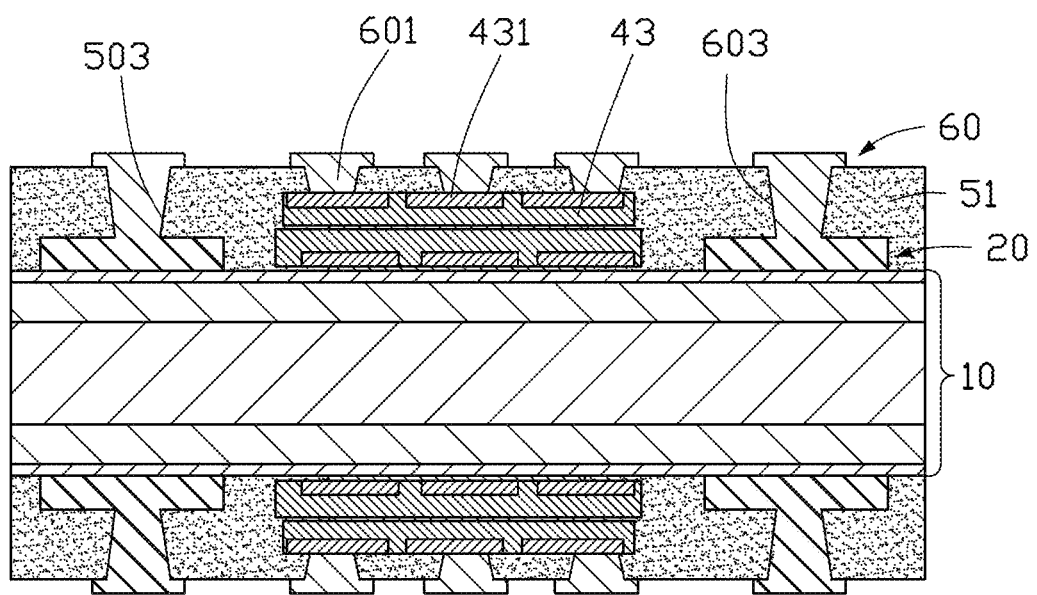
FIG. 9 is a cross-sectional view showing a first outer wiring layer, at least one first conductive structure, and at least one second conductive structure on the carrier of FIG. 8.

Step S8, referring to FIG. 9, a first outer wiring layer 60 is formed by performing a circuit manufacturing process on a side of the first build-up board 50 facing away from the carrier 10. A first conductive structure 601 is formed in each first connecting hole 501, and a second conductive structure 603 is formed in each second connecting hole 503.

The first conductive structure 601 electrically connects the first outer wiring layer 60 and the second electronic element 43. The second conductive structure 603 electrically connects the first outer wiring layer 60 and the inner wiring layer 20.

The first outer wiring layer 60 may include at least one connecting pad (not labeled).

Figure 10:
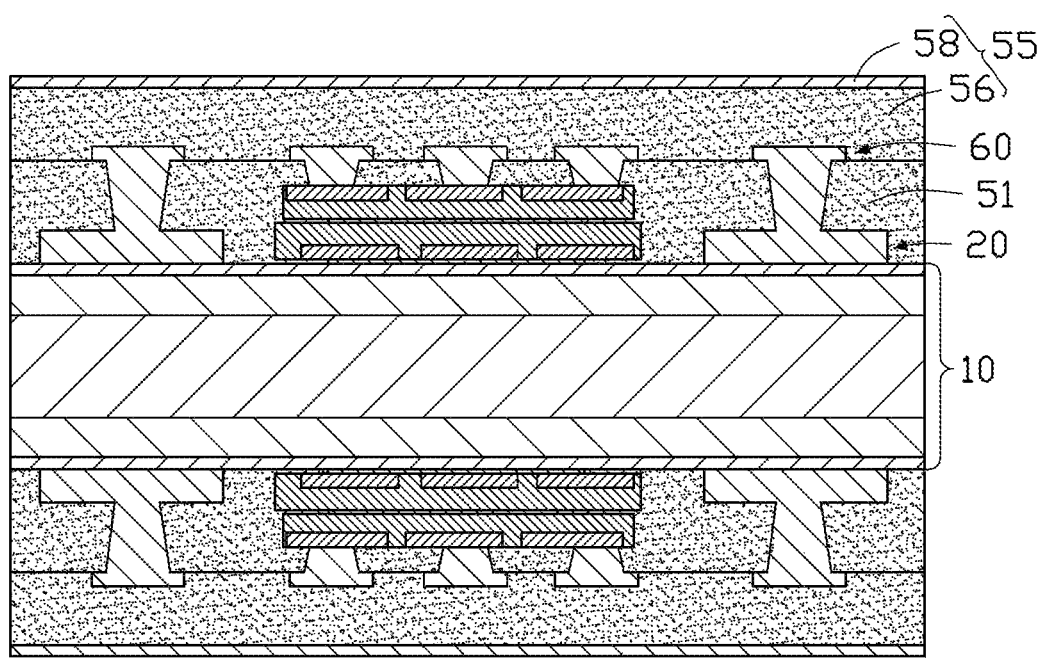
FIG. 10 is a cross-sectional view showing a second build-up board bonded with the first outer wiring layer of FIG. 9.

Step S9, referring to FIG. 10, a second build-up board 55 is pressed and bonded to a side of the first outer wiring layer 60 facing away from the carrier 10. The second build-up board 55 covers the first outer wiring layer 60 and infills gaps of the first outer wiring layer 60.

In at least one embodiment, the second build-up board 55 may include a second dielectric layer 56 and, a second copper layer 58 formed on a surface of the second dielectric layer 56. A surface of the second dielectric layer 56 facing away from the second copper layer 58 is combined with the first outer wiring layer 60. A fluidity of the second dielectric layer 56 increases during the pressing, and the second dielectric layer 56 infills gaps of the first outer wiring layer 60.

The second dielectric layer 56 may be made of a material selected from polypropylene, epoxy resin, polyurethane, phenolic resin, urea resin, melamine-formaldehyde resin, unsaturated polyester resin, polyimide, and any combination thereof.

In at least one embodiment, the number of the second build-up board 55 is two, which are pressed to opposite surfaces of the first outer wiring layers 60.

Figure 11:
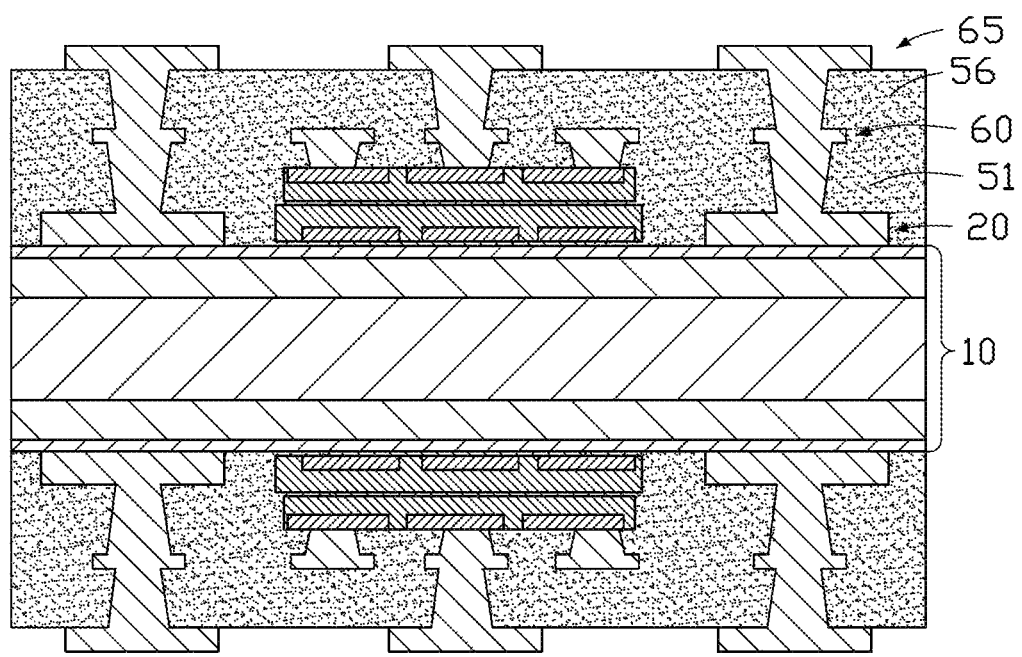
FIG. 11 is a cross-sectional view showing a second outer wiring layer on the first outer wiring layer of FIG. 10.

Step S10, referring to FIG. 11, a second outer wiring layer 65 is formed by performing a circuit manufacturing process on a side of the second build-up board 55 facing away from the first outer wiring layers 60. The second outer wiring layer 65 electrically connects the first outer wiring layer 60.

The second outer wiring layer 65 may include at least one connecting pad.

Figure 12:
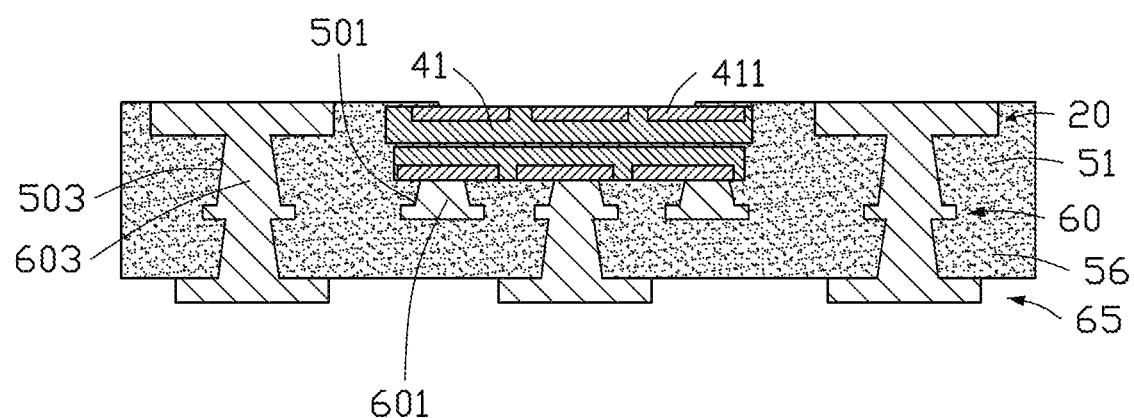
FIG. 12 is a cross-sectional view of an embodiment of a package structure.

Step S11, referring to FIG. 12, the carrier 10 is removed, and the first glue layer 31 is removed to expose the electrical connector of the first electronic element 41, thereby obtaining the package structure 100.

In at least one embodiment, the method for manufacturing the package structure may further include Step S12 and Step S13.

Figure 13:
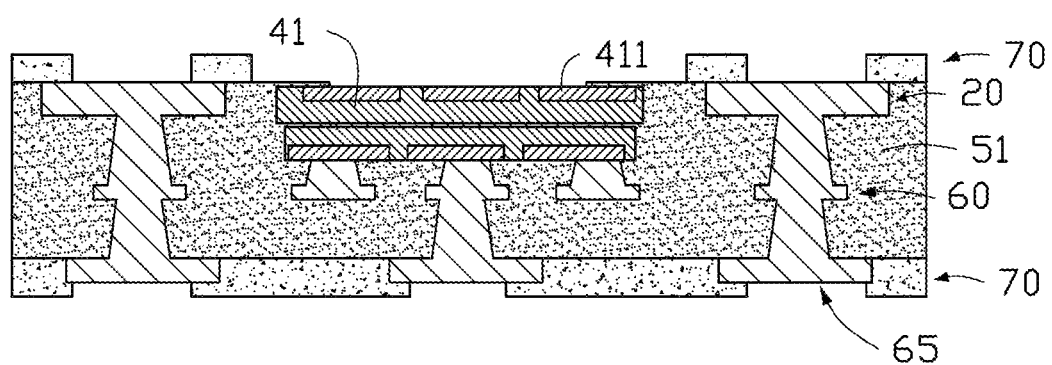
FIG. 13 is a cross-sectional view showing a solder mask on the package structure of FIG. 12.

Step S12, referring to FIG. 13, a solder mask 70 is formed on an outer surface of the package structure 100. The connecting pad (not labeled) on the outside surface of the package structure 100 and the electrical connector of the first electronic element 41 are exposed from the solder mask 70.

In at least one embodiment, the solder mask 70 is formed on a side of the inner wiring layer 20 facing away from the second outer wiring layer 65 and a side of the second outer wiring layer 65 facing away from the inner wiring layer 20. The connecting pad (not labeled) of the inner wiring layer 20, the connecting pad (not labeled) of the second outer wiring layer 65, and the electrical connector of the first electronic element 41 are exposed from the solder mask 70.

Figure 14:
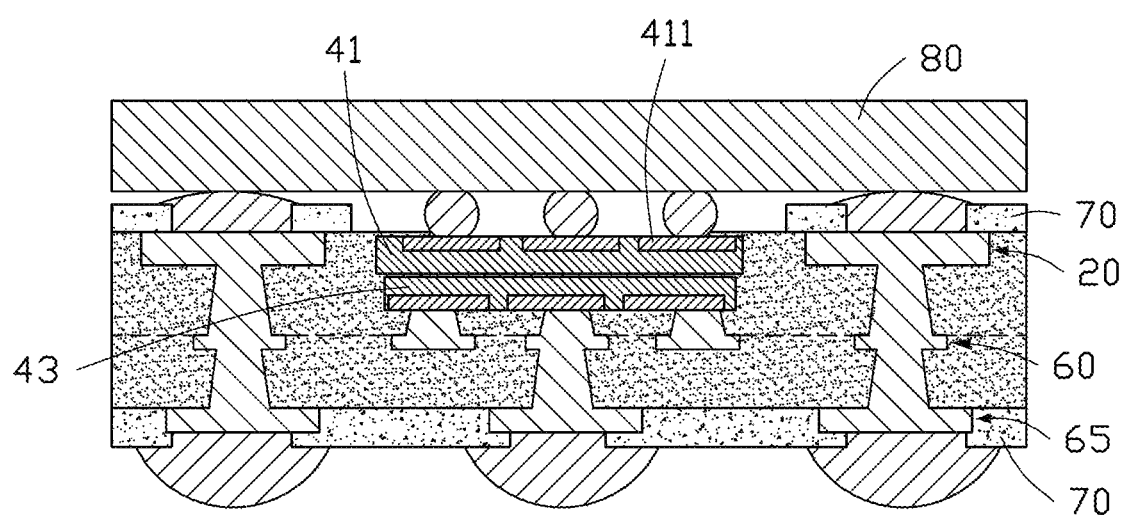
FIG. 14 is a cross-sectional view showing a third electronic element on the package structure of FIG. 13.

Step S13, referring to FIG. 14, a third electronic element 80 is formed on the package structure 100 to encapsulate the first electronic element 41 and the second electronic element 43. The third electronic element 80 electrically connects the electrical connector of first electronic element 41 and electrically connects the connecting pad of the inner wiring layer 20 by solder balls (not labeled).

In at least one embodiment, the third electronic element 80 may be a memory.

In at least one embodiment, the step 13 may further include forming solder balls (not labeled) corresponding to the connecting pad of the second outer wiring layer 65 exposed from the solder mask 70.

In at least one embodiment, referring to FIG. 2, the carrier 10 in the step 1 may include a base 11 and copper foils 13 formed on opposite surfaces of the base 11. The inner wiring layer 20 is formed on the copper foils 13 facing away from the base 11.

Figure 15:
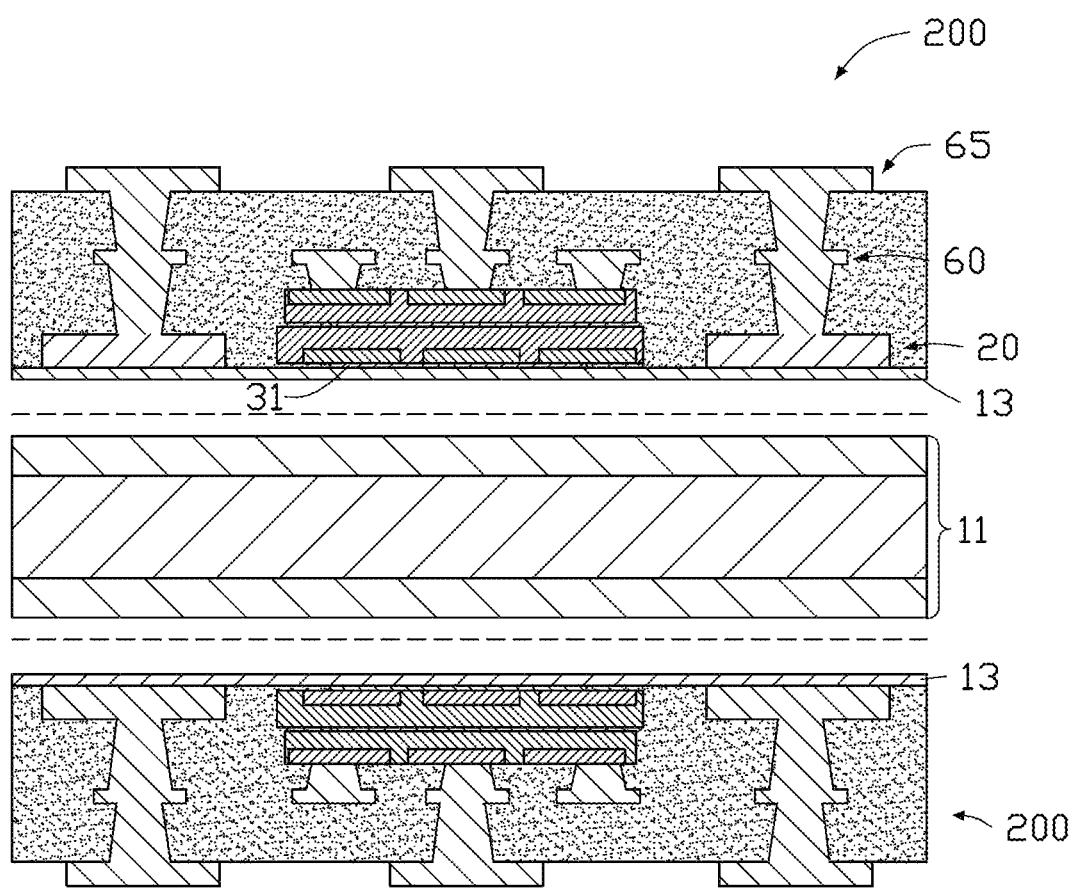
FIG. 15 is a cross-sectional view showing a base separated from copper foils of FIG. 11 to obtain intermediate structures with the copper foils.
Figure 16:
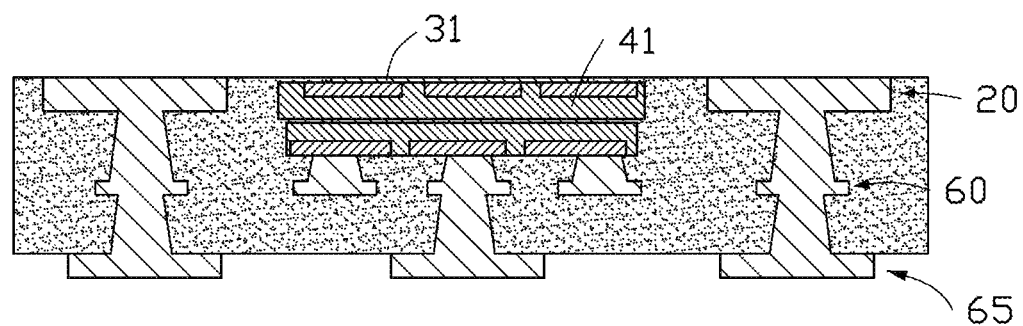
FIG. 16 is a cross-sectional view showing the intermediate structure of FIG. 15.

In at least one embodiment, the carrier 10 and the first glue layer 31 are removed by the following steps:

Referring to 1 FIG. 15, separating the base 11 from the copper foils 13 to obtain the base 11 and two intermediate structures 200 with the copper foils 13;

Referring to FIG. 16, removing the copper foil 13 from the intermediate structure 200 by rapid circuit etching; and Referring to FIG. 12, removing the first glue layer 31 to expose the electrical connector of the first electronic element 41, thereby obtaining the package structure 100.

In another embodiment, after the Step S10 and before the Step S11, other outer wiring layers may be formed by a build-up process.

In another embodiment, the Step S9 and the Step S10 may be omitted.

In another embodiment, the Step S12 may be omitted.

In another embodiment, the Step S13 may be omitted. In at least one embodiment, the memory may be replaced with other electronic components.

In at least one embodiment, the inner wiring layer 20 may be formed by the following, steps:

laying a photosensitive film (not shown) on the opposite surfaces of the carrier 10;

forming a mask pattern (not shown) by performing an exposure and development process on the photosensitive film;

forming the inner wiring layer 20 corresponding to the mask pattern by metal plating; and removing the photosensitive film after exposure and development.

Depending on the embodiment, certain of the steps of methods described may be removed, others may be added, and the sequence of steps may be altered. It is also to be understood that the description and the claims drawn to a method may include some indication in reference to sequential steps. However, the indication used is only to be viewed for identification purposes and not as a suggestion as to an order for the steps.

Figure 17:
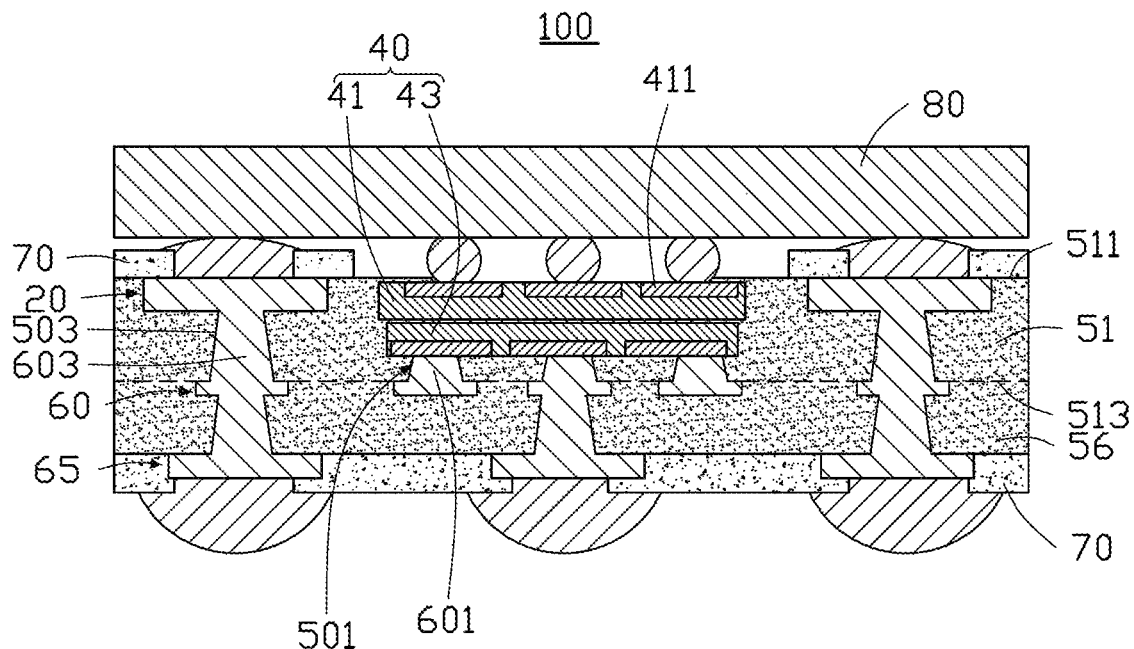
FIG. 17 is a cross-sectional view showing of an embodiment of a package structure.

FIG. 17 illustrates an embodiment of a package structure 100 including an inner wiring layer 20, a first dielectric layer 51, a first outer wiring layer 60, and an electronic component assembly 40. The first dielectric layer 51 includes a first surface 511 and a second surface 513 facing away from the first surface 511. The inner wiring layer 20 and the electronic component assembly 40 are embedded into the first dielectric layer 51 from the first surface 511. The inner wiring layer 20 is flush with the first surface 511. The first outer wiring layer 60 is disposed on the second surface 513. The electronic component assembly 40 includes a first electronic element 41 and a second electronic element 43. The second electronic element 43 is disposed close to the second surface 513, and an electrical connector of the second electronic element 43 faces the second surface 513. The first electronic element 41 is disposed on a side of the second electronic element 43 facing away from the second surface 513, and exposed from the first surface 511. The first outer wiring layer 60 electrically connects the electrical connector of the second electronic element 43 and the inner wiring layer 20, respectively.

In at least one embodiment, the electronic component assembly 40 is completely embedded in the first dielectric layer 51, and a surface of the electronic component assembly 40 facing away from the first outer wiring layer 60 is lower than the first surface 511.

In at least one embodiment, at least one first connecting hole 501 and at least one second connecting hole 503 are formed on the first dielectric layer 51. The first connecting hole 501 communicates with the first outer wiring layer 60 and the electrical connector of the second electronic element 43. The second connecting hole 503 communicates with the first outer wiring layer 60 and the inner wiring layer 20. The package structure 100 further includes a first conductive structure 601 in the first connecting hole 501 and a second conductive structure 603 in the second connecting hole 503. The first conductive structure 601 electrically connects the first outer wiring layer 60 and the electrical connector of the second electronic element 43. The second conductive structure 603 electrically connects the first outer wiring layer 60 and the inner wiring layer 20. second conductive structure 603 in the second connecting hole 503. The first conductive structure 601 electrically connects the first outer wiring layer 60 and the electrical connector of the second electronic element 43. The second conductive structure 603 electrically connects the first outer wiring layer 60 and the inner wiring layer 20.

The package structure 100 further includes a second dielectric layer 56 and a second outer wiring layer 65. The second dielectric layer 56 covers a side of the first outer wiring layer 60 facing away from the inner wiring layer 20, and infills gaps of the first outer wiring layer 60, The second outer wiring layer 65 is disposed on a side of the second dielectric layer 56 facing away from the inner wiring layer 20. The second outer wiring layer 65 electrically connects the first outer wiring layer 60.

In another embodiment, the package structure 100 may further include other dielectric layers and other outer wiring layers disposed on a side of the second outer wiring layer 65 facing away from the inner wiring layer 20.

The first dielectric layer 51 and the second dielectric layer 56 may be made of a material selected from polypropylene, epoxy resin, polyurethane, phenolic resin, urea resin, melamine-formaldehyde resin, unsaturated polyester resin, polyimide, and any combination thereof, respectively.

The package structure 100 may further include a solder mask 70. In at least one embodiment, the solder mask 70 is disposed on a side of the inner wiring layer 20 facing away from the first outer wiring layer 60 and the side of the second outer wiring layer 65 facing away from the first outer wiring layer 60. A connecting pad of the inner wiring layer 20, a connecting pad of the second outer wiring layer 65, and an electrical connector of the first electronic element 41 are exposed from the solder mask 70.

In at least one embodiment, a solder ball may be formed on the connecting pad of the second outer wiring layer 65 exposed from the solder mask 70.

The package structure 100 may further include a third electronic element 80. The third, electronic element 80 is disposed on the side of the inner wiring layer 20 facing away from the first outer wiring layer 60 to encapsulate the first electronic element 41 and the second electronic element 43. The third electronic element 80 electrically connects the electrical connector of the first electronic element 41 and electrically connects the connecting pad of the inner wiring layer 20.

In at least one embodiment, the third electronic element 80 electrically connects the electrical connector of the first electronic element 41 and electrically connects the connecting pad of the inner wiring layer 20 by solder balls.

In at least one embodiment, the first electronic element 41 and the second electronic element 43 are boned by an adhesive layer.

In the method for manufacturing the package structure, the first electronic element 41 and the second electronic element 43 are stacked and embedded in the first dielectric layer 51, thereby increasing the number of the embedded components. The electrical connector of the second electronic element 43 electrically connects the first outer wiring layer 60, and the first outer wiring layer 60 electrically connects the inner wiring layer 20. At the same time, the electrical connector of the first electronic element 41 is exposed from the first dielectric layer 51. So that the number of signal input/output channels (I/O count) of the package structure increases. In addition, the method for manufacturing the package structure is simple in process and easy to produce.

The above is only the preferred embodiment of the present invention, and does not limit the present invention in any form. Although the present invention has been disclosed as the preferred embodiment, it is not intended to limit the present invention. Any person skilled in the art, without departing from the scope of the technical solution of the present invention, when the technical contents disclosed above can be used to make some changes or modifications to equivalent equivalent implementations, if without departing from the technical solution content of the present invention, any simple modifications, equivalent changes and modifications made to the above embodiments based on the technical essence of the present invention still fall within the scope of the technical solution of the present invention.

What is claimed is:

1. A method for manufacturing a package structure comprising:
   providing a carrier and forming an inner wiring layer on a surface of the carrier, the inner wiring layer comprising at least one opening, a portion of the carrier exposed from the at least one opening;
   fixing a first electronic element on the carrier and the first electronic element received in each of the at least one opening, wherein an electrical connector of the first electronic element faces the carrier;
   fixing a second electronic element on a side of the first electronic element facing away from the carrier, wherein an electrical connector of the second electronic element faces away from the carrier;
   providing and pressing a first build-up board to the surface of the carrier with the inner wiring layer, wherein the first build-up board comprises a first dielectric layer and a first copper layer, the first dielectric layer covers the inner wiring layer and infills the at least one opening, the first copper layer is formed on a side of the first dielectric layer facing away from the carrier;
   forming at least one first connecting hole and at least one second connecting hole on the first build-up board, wherein the at least one first connecting hole corresponds to the second electronic element to expose the electrical connector of the second electronic element, the at least one second connecting hole corresponds to the inner wiring layer to expose a portion of the inner wiring layer;
   forming a first outer wiring layer by performing a circuit manufacturing process on a side of the first build-up board facing away from the carrier, forming a first conductive structure in each of the at least one first connecting hole to electrically connect the first outer wiring layer and the second electronic element, and forming a second conductive structure in each of the at least one second connecting hole to electrically connect the first outer wiring layer and the inner wiring layer;
   pressing a second build-up board to a side of the first outer wiring layer facing away from the carrier, the second build-up board covering the first outer wiring layer and infilling gaps of the first outer wiring layer;
   forming a second outer wiring layer by performing a circuit manufacturing process on a side of the second build-up board facing away from the carrier, the second outer wiring layer electrically connecting the first outer wiring layer; and
   removing the carrier to obtain the package structure, wherein the electrical connector of the first electronic element is exposed.

2. The method for manufacturing a package structure of claim 1, wherein after the step of "removing the carrier to obtain the package structure, wherein the electrical connector of the first electronic element is exposed", at least one connecting pad is located on an outermost surface of the package structure, the method further comprises:
   forming a solder mask on the outermost surface of the package structure, the at least one connecting pad located on the outermost surface of the package structure and the electrical connector of the first electronic element are exposed from the solder mask.

3. The method for manufacturing a package structure of claim 1, wherein after the step of "removing the carrier to obtain the package structure, wherein the electrical connector of the first electronic element is exposed", the method further comprises:
   forming a third electronic element on the package structure to encapsulate the first electronic element and the second electronic element, wherein the third electronic element electrically connects the electrical connector of the first electronic element and electrically connects a connecting pad of the inner wiring layer by solder balls.

4. The method for manufacturing a package structure of claim 1, wherein the first electronic element is fixed on the carrier by a first glue layer.

5. The method for manufacturing a package structure of claim 1, wherein the carrier comprises a base and copper foils formed on opposite surfaces of the base, the inner wiring layer is formed on a surface of the copper foils facing away from the base.

6. The method for manufacturing a package structure of claim 5, wherein the step of "removing the carrier to obtain the package structure, wherein the electrical connector of the first electronic element is exposed" further comprises:
   separating the base from the copper foils to obtain the base and two intermediate structures with the copper foils; and
   removing the copper foil from the intermediate structure by rapid circuit etching, and exposing the electrical connector of the first electronic element, thereby obtaining the package structure.

7. The method for manufacturing a package structure of claim 4, wherein fixing the first electronic element on the carrier and received in each of the at least one opening further comprises:
forming a first glue layer on carrier and received in each of the at least one opening; and
forming a first electronic element on a side of the first glue layer facing away from the carrier, wherein an electrical connector of the first electronic element faces the carrier.

8. The method for manufacturing a package structure of claim 1, wherein the second electronic element is fixed on the side of the first electronic element facing away from the carrier.

9. The method for manufacturing a package structure of claim 1, wherein the first dielectric layer is made of a material selected from polypropylene, epoxy resin, polyurethane, phenolic resin, urea resin, melamine-formaldehyde resin, unsaturated polyester resin, polyimide, and any combination thereof.

10. The method for manufacturing a package structure of claim 1, wherein the second build-up board comprises a second dielectric layer and a second copper layer, the second dielectric layer covers the first outer wiring layer and infills gaps of the first outer wiring layer.

11. The method for manufacturing a package structure of claim 10, the second dielectric layer is made of a material selected from polypropylene, epoxy resin, polyurethane, phenolic resin, urea resin, melamine-formaldehyde resin, unsaturated polyester resin, polyimide, and any combination thereof.

12. A package structure comprising:
an inner wiring layer;
a first dielectric layer;
a first outer wiring layer;
a second dielectric layer;
a second outer wiring layer; and
an electronic component assembly;
wherein the first dielectric layer comprises a first surface and a second surface facing away from the first surface, the inner wiring layer and the electronic component assembly are embedded into the first dielectric layer from the first surface, and the inner wiring layer is flush with the first surface, the first outer wiring layer is disposed on the second surface, the second dielectric layer covers a side of the first outer wiring layer facing away from the inner wiring layer, and infills gaps of the first outer wiring layer, the second outer wiring layer is disposed on a side of the second dielectric layer facing away from the inner wiring layer, the second outer wiring layer electrically connects the first outer wiring layer, the electronic component assembly comprises a first electronic element and a second electronic element, the second electronic element is disposed close to the second surface, and an electrical connector of the second electronic element faces the second surface, the first electronic element is disposed on a side of the second electronic element facing away from the second surface, and the first electronic element is exposed from the first surface, the first outer wiring layer electrically connects the electrical connector of the second electronic element and the inner wiring layer.

13. The package structure of claim 12, wherein at least one first connecting hole and at least one second connecting hole are formed on the first dielectric layer, the first connecting hole communicates with the first outer wiring layer and the electrical connector of the second electronic element, the second connecting hole communicates with the first outer wiring layer and the inner wiring layer, the package structure further comprises a first conductive structure in the first connecting hole and a second conductive structure in the second connecting hole, the first conductive structure electrically connects the first outer wiring layer and the electrical connector of the second electronic element, the second conductive structure electrically connects the first outer wiring layer and the inner wiring layer.

14. The package structure of claim 12, wherein the package structure further comprises a third electronic element, the third electronic element is disposed on a side of the inner wiring layer facing away from the first outer wiring layer, the third electronic element cooperates with the first dielectric layer to encapsulate the first electronic element and the second electronic element, the third electronic element electrically connects an electrical connector of first electronic element and electrically connects a connecting pad of the inner wiring layer.

15. The package structure of claim 12, wherein the second dielectric layer is made of a material selected from polypropylene, epoxy resin, polyurethane, phenolic resin, urea resin, melamine-formaldehyde resin, unsaturated polyester resin, polyimide, and any combination thereof.

16. The package structure of claim 12, further comprising a solder mask, wherein the solder mask is disposed on a side of the inner wiring layer facing away from the first outer wiring layer and a side of the second outer wiring layer facing away from the first outer wiring layer; a connecting pad of the inner wiring layer, a connecting pad of the second outer wiring layer, and an electrical connector of the first electronic element are exposed from the solder mask.

17. The package structure of claim 12, wherein the first dielectric layer is made of a material selected from polypropylene, epoxy resin, polyurethane, phenolic resin, urea resin, melamine-formaldehyde resin, unsaturated polyester resin, polyimide, and any combination thereof.

* * * * *